United States Patent [19]
Iwata

[11] Patent Number: 5,982,043
[45] Date of Patent: Nov. 9, 1999

[54] SEMICONDUCTOR DEVICE HAVING TWO OR MORE BONDING OPTION PADS

[75] Inventor: Katsutoshi Iwata, Tokyo, Japan

[73] Assignee: NEC Corporation, Tokyo, Japan

[21] Appl. No.: 08/857,443

[22] Filed: May 16, 1997

[30] Foreign Application Priority Data

May 16, 1996 [JP] Japan ................................. 8-121240

[51] Int. Cl.$^6$ ........................... H01L 23/48; H01L 23/52; H01L 29/40

[52] U.S. Cl. ........................ 257/786; 257/784; 257/690; 257/691; 257/695

[58] Field of Search ................................ 257/786, 666, 257/690, 691, 784, 695

[56] References Cited

U.S. PATENT DOCUMENTS

| | | | |
|---|---|---|---|
| 5,280,605 | 1/1994 | Young et al. | 395/550 |
| 5,563,443 | 10/1996 | Beng et al. | 257/666 |
| 5,587,607 | 12/1996 | Yasuda et al. | 257/690 |
| 5,701,031 | 12/1997 | Oguchi et al. | 257/786 |

FOREIGN PATENT DOCUMENTS 5-62465  3/1993  Japan .

Primary Examiner—Mahshid Saadat
Assistant Examiner—Jhihan B Clark

[57] ABSTRACT

Two or more bonding option pads are aligned in a predetermined direction on a semiconductor chip. Leads on higher and lower potential sides are provided on both sides of the bonding option pads such that the leads are extended in the direction passing across the predetermined direction. At least one of the bonding option pads is connected to at least one of the leads by means of a bonding wire.

8 Claims, 4 Drawing Sheets

| OPERATION MODE | | BO0 | BO1 | BO2 | BO3 |
|---|---|---|---|---|---|
| X1 | 4KRef FP | GND | GND | VCC | VCC |
|  | 2KRef FP | GND | GND | GND | VCC |
| X4 | 4KRef FP | GND | GND | VCC | GND |
|  | EDO | GND | VCC | VCC | GND |
|  | 2KRef FP | GND | VCC | GND | VCC |
|  | EDO | GND | VCC | GND | GND |
| X8 | 4KRef FP | VCC | GND | GND | GND |
|  | EDO | VCC | GND | VCC | GND |
|  | 2KRef FP | VCC | GND | GND | VCC |
|  | EDO | VCC | VCC | GND | GND |

SEMICONDUCTOR DEVICE HAVING TWO OR MORE BONDING OPTION PADS

BACKGROUND OF THE INVENTION

The present invention relates to a semiconductor device having two or more bonding option pads.

Typical semiconductor devices such as dynamic read-only memories (DRAMs) have a semiconductor chip provided with a bonding option pad. The bonding option pad is for use in "choosing" functions of a semiconductor device during a bonding step. A reason for the necessity of such a bonding option pad is that a function of the semiconductor device should be modified depending on functions or requirements of instruments wherein the semiconductor device is mounted. For example, the semiconductor device can be used as a dynamic RAM for a single bit (×1 bit) configuration by means of connecting the bonding option pad to one of a lead on the power supply side (hereinafter, referred to as a lead on the higher potential side) and a lead on the ground lead (hereinafter, referred to as a lead on the lower potential side). On the other hand, the semiconductor device can be used as a dynamic RAM for a four bits (×4 bit) configuration by means of connecting the bonding option pad to the other lead.

Selective connection between the bonding option pad and the lead on the higher or the lower potential side allows to provide semiconductor devices having various functions.

A conventional semiconductor device of this type is disclosed in, for example, Japanese Patent Laid-open No. 62465/1993 (Tokkai Hei 5-62465)(hereinafter, referred to as a cited reference). The semiconductor device disclosed comprises the leads on the higher and the lower potential sides extended in a predetermined direction with the bonding option pad positioned between the leads on the higher and the lower potential sides adjacent thereto. The bonding option pad is bonded to either the lead on the higher potential side or the lead on the lower potential side. In this semiconductor device, the potential on the bonding option pad corresponds to the one applied to the leads on the higher or the lower potential side. This configuration allows avoiding a level fluctuation at an input of a selective signal generation circuit connected to the bonding option pad.

The cited reference discloses only the case where the leads on the higher and the lower potential sides are positioned on both sides of the single bonding option pad. It is not contemplated therein to provide two or more bonding option pads.

There is a conventional semiconductor device having two or more bonding pads, an example of which is described now. The bonding pads are arranged in one direction on a semiconductor chip. The bonding option pads are each connected to the leads on the higher and the lower potential sides at the ends of the pad. The leads are in parallel with each other and configured into a bus. The leads on the higher and the lower potential sides are thus extending in the direction parallel to the bonding option pads.

In the semiconductor device of the type described, it is difficult to arrange an additional signal lead due to the leads on the higher and the lower potential sides because they are in parallel with the bonding pads. Therefore, the signal lead and a signal pad allocated thereto are connected to each other by means of, for example, over-bonding with a bonding wire crossing across the lead on the higher potential side. Connection between the signal pad and the signal lead by the over-bonding requires to ensure complete insulation of the bonding wire in order to avoid electrical contact between the bonding wire for the over-bonding and the lead on the higher or the lower potential side. To this end, the bonding wire for the over-bonding is away from the lead on the higher or the lower potential side at a sufficient distance. In addition, the bonding wire itself is coated with an insulating material.

Furthermore, the semiconductor chip is enlarged because of a resin used to seal it because a larger amount of resin is used to increase the thickness of the resin after sealing.

Accordingly, an object of the present invention is to provide a semiconductor device in which a lead on the higher or the lower potential side connected to a bonding option pad has no adverse effect on other leads.

Another object of the present invention is to provide a semiconductor device in which the connection between a signal pad and a signal lead is achieved without over-bonding.

It is yet another object of the present invention to provide a semiconductor device of which manufacturing requires no consideration about electrical insulation of a bonding wire to be used for the bonding option pad.

SUMMARY OF THE INVENTION

A semiconductor device according to the present invention comprises two or more bonding option pads arranged in a predetermined direction on a semiconductor chip and leads on a higher and a lower potential sides arranged on the semiconductor chip. The leads are located on both sides of the bonding option pads.

According to an aspect of the present invention, the leads on the higher and the lower potential sides each has a portion extending in a predetermined direction passing across the predetermined direction and apart from each other.

DESCRIPTION OF THE PREFERRED EMBODIMENTS

Figure 1:
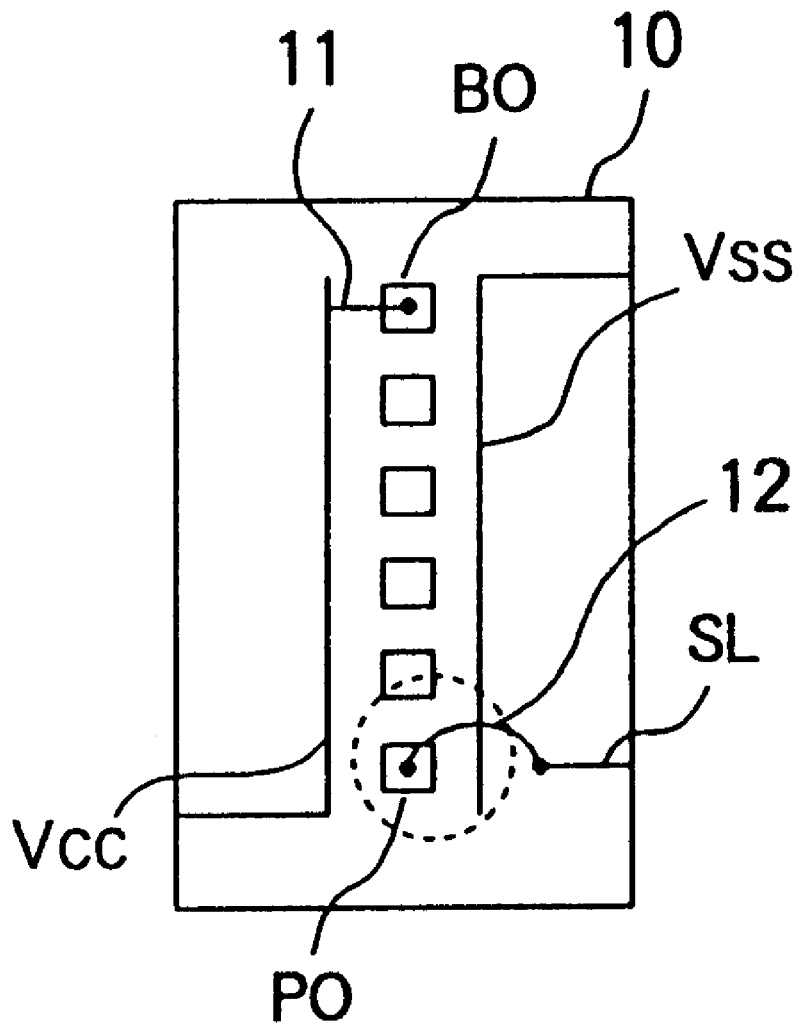
FIG. 1 is a view for use in describing a positional relationship between leads and bonding option pads in a conventional semiconductor device.

Referring to FIG. 1, an example of a conventional semiconductor device is described for the purpose of facilitating the understanding of the present invention. Two or more bonding option pads are aligned in a predetermined direction on a semiconductor chip 10. One of the bonding option pads is indicated by BO, which is to be connected to either a lead Vcc on the higher potential side or a lead Vss on the lower potential side. One of the remaining bonding option pads is indicated by PO, which is to be connected to a signal lead SL. The leads Vcc and Vss on the higher and the lower potential sides, respectively, are arranged in parallel with each other to configure like a bus on the semiconductor chip 10. In other words, the leads Vcc and Vss on the higher and the lower potential sides, respectively, extend in the same direction with the alignment of the bonding option pads. It is noted that the semiconductor chip 10 is illustrated only in partial in FIG. 1 and the signal lead shown is only one of a plurality of signal leads.

A shorter bonding wire 11 is required to connect between the bonding option pad BO and the leads Vcc or Vss on the higher or the lower potential sides when the bonding option pads are arranged in parallel with the leads Vcc and Vss on the higher and the lower potential sides, respectively. This configuration, however, has such a drawback that it becomes difficult to another signal lead SL due to the leads Vcc and Vss on the higher and the lower potential sides. Therefore, the signal lead SL and the signal pad PO allocated thereto are connected to each other by means of over-bonding with a bonding wire 12 crossing across the lead Vss on the lower potential side.

Connection between the signal pad PD and the signal lead SL by the over-bonding requires to ensure complete insulation of the bonding wire 12 in order to avoid electrical contact between the bonding wire 12 and the lead Vss on the lower potential side. To this end, the bonding wire 12 away from the lead Vss on the lower potential side at a sufficient distance. In addition, the bonding wire 12 itself is coated with an insulating material.

The semiconductor chip 10 is sealed with a resin in a subsequent step. In this event, the semiconductor chip is enlarged because of a resin used to seal it because a larger amount of resin is used to increase the thickness of the resin after sealing.

Figure 2:
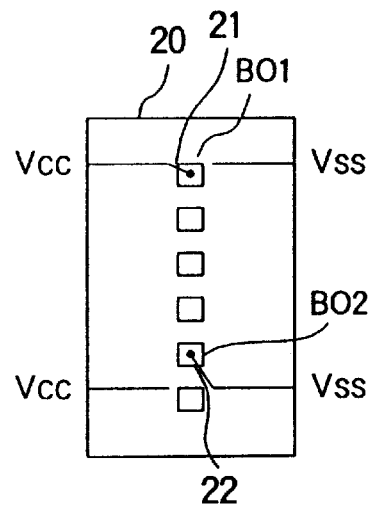
FIG. 2 is a view for use in describing a principle of the present invention.

Referring to FIG. 2, a semiconductor device according to the present invention is described in principle. FIG. 2 shows a part of a 16-Mb dynamic RAM chip 20 as a semiconductor device that comprises two leads Vcc on the higher potential side and two leads Vss on the lower potential side. These leads Vcc and Vss on the higher and the lower potential sides are provided on both sides of the dynamic RAM chip 20. The leads Vcc on the higher potential side are opposing to the leads Vss on the lower potential side. Bonding option pads BO1 and BO2 are arranged in a predetermined direction along with other signal pads on the dynamic RAM chip 20.

In this embodiment, the two leads Vcc on the higher potential side extend in the direction passing across the alignment of the bonding option pads BO1 and BO2 on the dynamic RAM chip 20. Likewise, the two leads Vss on the lower potential side extend in the direction passing across the alignment of the bonding option pads. The leads Vcc and Vss on the higher and the lower potential sides, respectively, each extends to a position just adjacent to the bonding option pads BO1 and BO2. Any adverse effects on other signal leads can be minimized by means of the alignment of the leads Vcc and Vss on the higher and the lower potential sides because the leads Vcc and Vss on the higher and the lower potential sides extend in the direction crossing with the alignment of the bonding option pads.

In this example, the lead Vcc on the higher potential side is connected to the bonding option pad BO1 through a bonding wire 21 while the lead Vss on the lower potential side is connected to the bonding option pad BO2 through a bonding wire 22. No over-bonding is required in this configuration where the leads Vcc and Vss on the higher and the lower potential sides are extended in the direction crossing to the alignment of the bonding option pads and are connected at their ends with the bonding option pads BO1 and BO2 through the bonding wires 21 and 22, respectively. In addition, it is possible to avoid fluctuation of a logical level by means of connecting the bonding option pads BO1 and BO2 with either of the leads Vcc and Vss on the higher and the lower potential sides.

Figure 3:
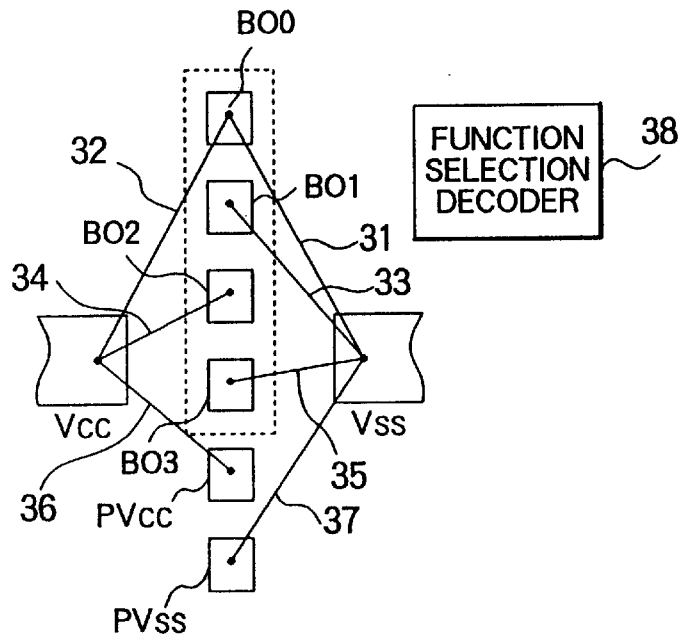
FIG. 3 is a plan view for use in describing a semiconductor device according to a first embodiment of the present invention.

Referring to FIG. 3, a first embodiment of the present invention is described. Four bonding option pads BO0 through BO3 are provided in a region indicated by a dot line on the semiconductor chip. The bonding option pads BO0 through BO3 are aligned in a predetermined direction along with power supply pads PVcc and PVss. The leads Vcc and Vss on the higher and the lower potential sides are arranged on both sides of the pads in the direction crossing across the alignment of the pads. The four bonding option pads BO0 through BO3 should be connected at least one of the leads Vcc and Vss on the higher and the lower potential sides through bonding wires 31 through 35. The power supply pads PVcc and PVss are connected to the leads Vcc and Vss on the higher and the lower potential sides through bonding wires 36 and 37, respectively.

A function selection decoder 38 is provided on the semiconductor chip. The function selection decoder 38 is connected to the bonding option pads BO0 through BO3 by means of wiring that is not shown.

Figures 4, 5:
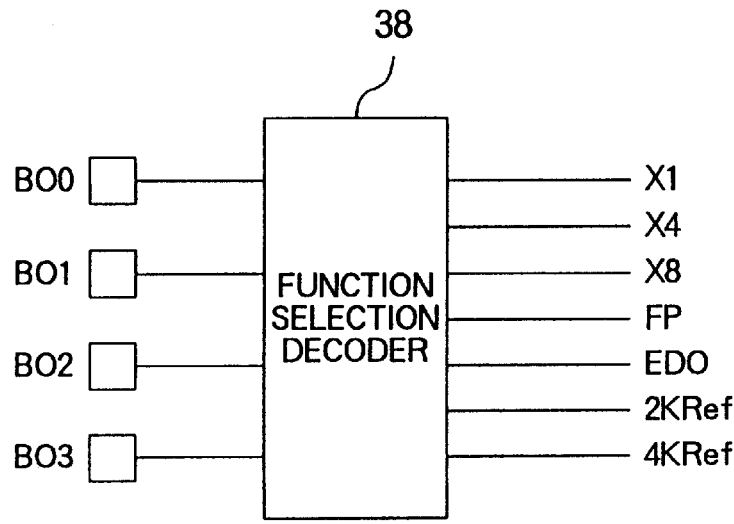
FIG. 4 is a view for use in describing connections and operational modes of the bonding option pads in the semiconductor device shown in FIG. 3.
FIG. 5 is a view for use in describing more in detail the operational modes described in conjunction with FIGS. 3 and 4.

Referring also FIGS. 4 and 5, the function selection decoder 38 is described. The function selection decoder 38 is for use in choosing operational modes of the dynamic RAM. This selection is achieved by means of switching the connection between the bonding option pads BO0 through BO3 and the leads Vcc and Vss on the higher and the lower potential sides. More specifically, the operational mode of the dynamic RAM is chosen depending on to which leads of those on the higher and the lower potential sides the bonding option pads BO0 through BO3 are connected. In this embodiment, the operational mode of the dynamic RAM can be any one of a single bit (×1 bit) configuration, a four bits (×4 bit) configuration, and an eight bits (×8 bit) configuration as shown in FIG. 5. It is noted that the lead Vss on the lower potential side in FIG. 5 is applied with a ground potential GND. The connection of the bonding option pads BO0 through BO3 as shown in FIG. 5 allows changing of a refresh cycle between 2 KHz and 4 KHz as shown in FIG. 4 and operation of the dynamic RAM in either an FP or an EDO mode.

As a result, the function selection decoder 38 produces a control signal indicative of a function determined depending on the connection of the bonding option pads BO0 through BO3. For example, the control signal is produced on a signal line bearing a sign indicative of ×8, FP, and 2 KRef when the dynamic RAM has the eight bits configuration and is operated in the FP mode at the refresh cycle of 2 KHz.

The dynamic RAM is operated as a memory having the four bits configuration indicated in a third row of the table in FIG. 5 when the bonding option pads BO0, BO1 and BO3 are connected to the lead Vss on the lower potential side and the bonding option pads BO0 and BO2 are connected to the lead Vcc on the higher potential side as shown in FIG. 3. In any case, the leads Vcc and Vss on the higher and the lower potential sides are required to have a width sufficient to connect two or more bonding wires thereto.

Figure 6:
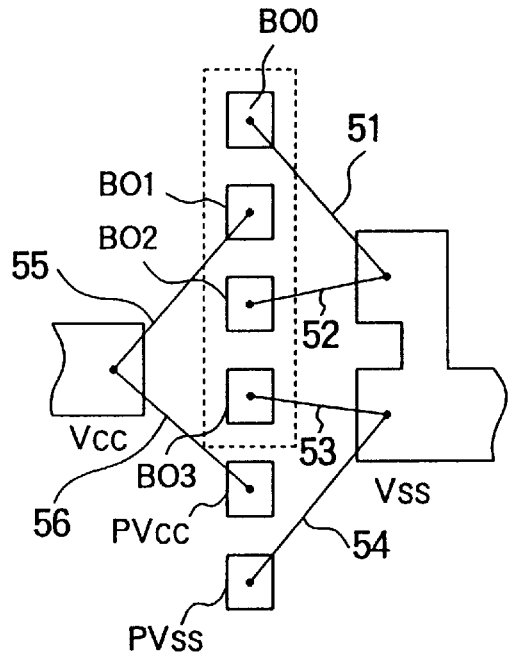
FIG. 6 is a view for use in describing locations of the leads and the bonding option pads in a semiconductor device according to a second embodiment of the present invention.

Referring now to FIG. 6, a second embodiment of the present invention is described. In this embodiment, the four bonding option pads BO0 through BO3 are aligned on the semiconductor chip along with the power supply pads PVcc and PVss. The lead Vss on the lower potential side is elongated in the direction parallel to the alignment of the bonding option pads BO0 through BO3 at a position opposing to the bonding option pads BO0 through BO3. In other words, the leads Vss on the lower potential side is branched into two sections, i.e., is forked at a position adjacent to the bonding option pads BO0 through BO3. This allows connection of two sets of bonding wires, 51 and 52, and 53 and 54, to the respective sections of the lead. In this embodiment, the bonding option pads BO0, BO2, and BO3 are connected to the lead Vss on the lower potential side while the bonding option pad BO1 alone is connected to the lead Vcc on the higher potential side through a bonding wire 55. The power supply pads PVss and PVcc are connected to the leads Vss and Vcc on the lower and the higher potential sides through the bonding wires 54 and 56, respectively. This configuration corresponds to the fifth row from the bottom of the table shown in FIG. 5. The dynamic RAM thus serves as a memory having the fourth bits EDO configuration.

While the present invention has thus been described in conjunction with the case where the leads Vcc and Vss on the higher and the lower potential sides are arranged on the semiconductor chip as shown in FIGS. 3 and 6, i.e., the semiconductor chip has a so-called lead-on-chip structure, the present invention may be applied to those having a chip-on-lead structure. The bonding option pads BO0 through BO3 illustrated in FIGS. 3 and 6 are bonded without fail to either one of the leads on the higher and the lower potential sides. Accordingly, no fluctuation of the potential occurs on the bonding option pads BO0 through BO3. This eliminates necessity of providing a pull-up resistance or a pull-down resistance in a circuit on the semiconductor chip to which the bonding option pads BO0 through BO3 are to be connected. As a result, any adverse effects can be avoided that otherwise may arise due to the current flowing through the pull-up or the pull-down resistance.

Figure 7:
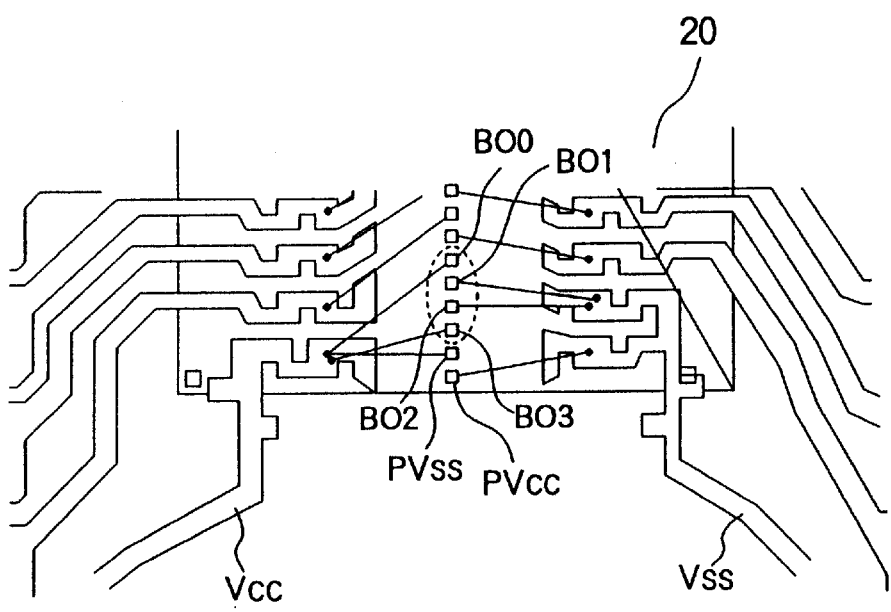
FIG. 7 is a partial wiring diagram for use in describing a specific embodiment of the present invention.

Referring to FIG. 7, a specific embodiment of the present invention is described. In this specific embodiment, bonding option pads are aligned at a center of a semiconductor chip 20. Three bonding option pads located upper than the others in the figure are actual pads such as signal pads. Two bonding option pads located lower than the others in the figure are power supply pads PVcc and PVss. Four bonding option pads BO0 through BO3 are aligned between the actual pads and the power supply pads PVcc and PVss.

Leads are provided on both sides of the pads such that the leads are extending in the direction crossing across the alignment of the pads. The leads extend out of the semiconductor chip 20. The lead located at the lowermost position in the figure forms the lead Vcc and Vss on the higher and the lower potential sides as in the embodiment described above. The leads Vcc and Vss on the higher and the lower potential sides each has a portion extending in the direction passing across the alignment of the bonding option pads on the semiconductor chip 20. The lead Vss on the lower potential side is branched into two sections at a position adjacent to the bonding option pads. The branched sections are each extended in the direction passing across the alignment of the pads.

The leads Vcc and Vss on the higher and the lower potential sides are electrically connected to the power supply pads PVcc and PVss, respectively. The bonding option pads BO0 and BO3 are connected to the lead Vcc on the higher potential side while the bonding option pads BO1 and BO2 are connected to the lead Vss on the lower potential side. As a result, the embodiment illustrated in FIG. 7 serves as a dynamic RAM having the function indicated in a second row of the table in FIG. 5. This arrangement of the lead Vcc and Vss on the higher and the lower potential sides makes it unnecessary to change arrangement of other signal leads due to the leads Vcc and Vss which are arranged as shown in FIG. 7.

As described above, the present invention eliminates the over-bonding by means of providing the leads on the higher and the lower potential sides in the direction passing across the alignment of the bonding option pads. In addition, the present invention requires no measure against the electrical contact between the bonding wire to be connected to the leads on the higher and the lower potential sides and other leads. Furthermore, it is unnecessary to increase the thickness of the resin used for sealing the semiconductor chip. This reduces the entire dimension of the semiconductor chip.

What is claimed is:

1. A semiconductor device comprising two or more bonding option pads arranged in a predetermined direction on a semiconductor chip and leads on higher and lower potential sides arranged on said semiconductor chip, the leads being located on both sides of said bonding option pads, wherein said leads on the higher and the lower potential sides each has a portion extending in a predetermined direction passing across the predetermined direction and apart from each other, wherein said bonding option pads comprise a signal pad, and a signal lead is provided on said semiconductor chip, said signal lead being connected to said signal pad with being adjacent to said leads, said signal lead being arranged such that allows connection between said signal lead and said signal pad without over-bonding across said leads; and a decoder for decoding a signal supplied from said bonding option pads, said decoder being connected to said bonding option pads and said leads, operational modes of said semiconductor device being chosen by said decoder.

2. A semiconductor device as claimed in claim 1, wherein at least one of said leads is connected to one of the bonding option pads.

3. A semiconductor device as claimed in claim 1, wherein at least one of said leads is branched or forked at a position adjacent to said bonding option pads.

4. A semiconductor device as claimed in claim 1, wherein each of the leads has the portion extending in the predetermined direction.

5. A semiconductor device as claimed in claim 1, wherein said semiconductor chip has either a lead-on-chip structure or a chip-on-lead structure.

6. A semiconductor device as claimed in claim 1, wherein said bonding option pads are arranged at a central portion of said semiconductor chip.

7. A semiconductor device as claimed in claim 1, wherein said leads are connected to said bonding option pads at two or more bonding points.

8. A semiconductor device as claimed in claim 1, wherein at least one of said leads has such a configuration that allows connection with said bonding option pads at two or more positions.

* * * * *